United States Patent
Bar-David

(10) Patent No.: US 6,492,867 B2
(45) Date of Patent: Dec. 10, 2002

(54) METHOD AND APPARATUS FOR IMPROVING THE EFFICIENCY OF POWER AMPLIFIERS, OPERATING UNDER A LARGE PEAK-TO-AVERAGE RATIO

(75) Inventor: Israel Bar-David, Haifa (IL)

(73) Assignee: Paragon Communications Ltd., Haifa (IL)

(*) Notice: Subject to any disclaimer, the term of this patent is extended or adjusted under 35 U.S.C. 154(b) by 0 days.

(21) Appl. No.: 09/815,196

(22) Filed: Mar. 22, 2001

(65) Prior Publication Data

US 2001/0054931 A1 Dec. 27, 2001

Related U.S. Application Data

(63) Continuation-in-part of application No. 09/670,439, filed on Sep. 26, 2000, and a continuation of application No. PCT/IL01/00221, filed on Mar. 8, 2001.
(60) Provisional application No. 60/188,194, filed on Mar. 10, 2000.

(51) Int. Cl.[7] .................................................. H03F 3/38
(52) U.S. Cl. ......................................... 330/10; 330/136
(58) Field of Search ........................... 330/10, 136, 285

(56) References Cited

U.S. PATENT DOCUMENTS

| | | | |
|---|---|---|---|
| 2,210,028 A | | 8/1940 | Doherty |
| 5,142,240 A | * | 8/1992 | Isota et al. .................... 330/136 |
| 5,420,536 A | | 5/1995 | Faulkner et al. ............. 330/149 |
| 5,442,317 A | * | 8/1995 | Stengel .......................... 330/10 |
| 5,745,526 A | * | 4/1998 | Kumm et al. ................ 330/127 |
| 5,883,927 A | * | 3/1999 | Madsen et al. .............. 330/127 |
| 5,886,575 A | | 3/1999 | Long ............................ 330/129 |
| 5,898,342 A | | 4/1999 | Bell ............................. 330/297 |
| 5,929,702 A | * | 7/1999 | Myers et al. .................. 330/10 |
| 6,028,486 A | | 2/2000 | Andre .......................... 330/297 |
| 6,175,372 B1 | * | 1/2001 | Takita .......................... 330/10 |

FOREIGN PATENT DOCUMENTS

EP 1041712 10/2000

OTHER PUBLICATIONS

Circuit Technology for Mobile/Personal Communications by Nojima et al. (XP 000643169) pp. 220–229.
"Clipping Noise Mitigation for OFDM by Decision–Aided Reconstruction" by Kim et al.; IEEE Communications Letters, vol. 3, No. 1, Jan. 1999.
"Design Considerations for Multicarrier CDMA Base Station Power Amplifiers" (Microwave Journal—Feb. 1999) pp. 76–86.

(List continued on next page.)

Primary Examiner—Robert Pascal
Assistant Examiner—Khanh Van Nguyen
(74) Attorney, Agent, or Firm—BakerBotts, LLP

(57) ABSTRACT

Method and apparatus for improving the efficiency and the dynamic range of a power amplifier operated with signals having a large peak-to-average ratio. A reference level is determined, above which at least a portion of the magnitude of an input signal being a modulated signal that is input to the power amplifier, or a baseband waveform that is used to generate the modulated signal, is defined as an excess input signal. The magnitude of the input signal is continuously sampled, for detecting an excess input signal. A lower level of operating voltage is supplied to the power amplifier, if no excess input signal is detected. The lower level of operating voltage is sufficient to effectively amplify input signals having a magnitude below the reference level. A higher level of operating voltage is supplied to the power amplifier, whenever an excess input signal is detected. The higher level of operating voltage is sufficient to effectively amplify input signals having a magnitude above the reference level.

31 Claims, 7 Drawing Sheets

OTHER PUBLICATIONS

"Considerations on Applying OFDM in a Highly Efficient Power Amplifier" by Liu et al. IEEE Transactions on Circuits and Systems—II Analog and Digital Signal Processing vol. 46, NO. 11, Nov. 1999. pp. 1329–1335.

"Device and Circuit Approaches for Next–Generation Wireless Communications" by Asbeck et al.; (Microwave Journal—Feb. 1999; pp. 22–42.

Nojima, T. et al., "Circuit Technology . . . Communications", European Microwave Conference Proceedings, GB, Nexus Business Communications, vol. CONF. 24, Sep. 5, 1994, pp. 220–229.

Kim et al., "Clipping Noise . . . Reconstruction", IEEE Communications Letters, vol. 3, No. 1, Jan. 1999.

Kenney, J.S. e tla., "Design Considerations on . . . Amplifier", Microwave Journal, Feb. 1999.

Liu, W. et al., "Considerations on . . . Amplifier", IEEE Transactions on Circuits and Systems, vol. 46, No. 11, Nov. 1999.

Asbeck, P. et al., "Device and . . . Communications", Microwave Journal, Feb. 1999.

* cited by examiner

METHOD AND APPARATUS FOR IMPROVING THE EFFICIENCY OF POWER AMPLIFIERS, OPERATING UNDER A LARGE PEAK-TO-AVERAGE RATIO

This is a continuation-in-part of application Ser. No. 09/670.439 filed Sep. 26, 2000, claiming priority of Provisional application No. 60/188,194 filed Mar. 10, 2000, and is also a continuation of International application PCT/IL01/00221 filed on Mar. 8. 2001, all of which are incorporated by reference herein.

FIELD OF THE INVENTION

The present invention relates to the field of power amplifiers. More particularly, the invention relates to a method and apparatus for improving the efficiency of power amplifiers operating under large peak-to-average ratios, while eliminating the need for clipping signals having large peak amplitudes.

BACKGROUND OF THE INVENTION

Modern communication systems, such as cellular systems employ power amplifiers in their basestations, in order to communicate with subscribers that are distributed in cells. These power amplifiers that are required to amplify Radio Frequency (RF) signals, such as signals used in communication systems that are required to transmit multiple signals, simultaneously. Multiple signals should be transmitted, for example, due to multiple users sharing the same frequency band, such as cellular systems that are operated in Code Division Multiple Access (CDMA) regimes. Another communication method that requires simultaneous transmissions employ, for example, a modulation format known as "multitone", or Orthogonal Frequency Division Multiplexing (OFDM), in which the signal from a single user is first subdivided. Each subdivision is then modulated by a multiplicity of staggered subcarriers. The modulated subcarriers are then added up, thus causing large peak excursions.

Conventional RF amplifiers required to simultaneously amplify RF signals that have large peak-to-average ratios, are costly and relatively inefficient (consuming much DC power). The reason for such inefficiency is that a power amplifier becomes efficient only during the occurrence of the peaks, i.e., when the instantaneous power output is large. However, during most of the time, the power output is only a small fraction of the power drain from the Direct Current (DC) power supply, resulting in low efficiency.

In order to reduce the average power loss, communication system designers use conventional techniques for reducing the peak to average ratio, based on clipping of the signal peaks. "Keeping noise mitigation for ODFM by decision-aided reconstruction" to Kim et al, IEEE Communications Letters, Vol. 3, No. 1, January 1999 and "Design considerations for multicarrier CDMA base station power amplifiers", to J. S. Kenney et al, Microwave Journal, February 1999, describe such techniques, which treat OFDM and multicarrier communications. It is also explained there that clipping considerably increases the undesired error rate of the system, and in some cases causes a partial spectral re-growth. Considerable effort is directed to mitigate the increase in the error rate while increasing the amount of clipping.

"Considerations on applying OFDM in a highly efficient power amplifier" to W. Liu et al, IEEE transactions on circuits and systems, Vol. 46, No. 11, November 1999, relates to the classical Envelope Elimination and Reconstruction (EER) for OFDM. "Device and circuit approaches for next-generation wireless communications" to P. Asbeck et al, Microwave Journal, February 1999, discloses similar features EER for OFDM, with sundry modifications for multicarrier transmission. However, all the above references depend on continuously varying power supplies for the envelope reconstruction or emphasis, which is difficult to achieve at large bandwidths and large peak to average ratios. Furthermore, EER techniques are mostly used for low-frequency modulation.

All the methods described above have not yet provided satisfactory solutions to the problem of improving the efficiency of power amplifiers operated under large peak-to-average ratios, while eliminating the need for clipping signals having large peak amplitudes.

It is an object of the present invention to provide a method and apparatus for improving the efficiency of power amplifiers operated under large peak-to-average ratios, while eliminating the need for clipping signals.

It is another object of the present invention to provide a method and apparatus for improving the efficiency of power amplifiers operated under large peak-to-average ratios, while eliminating spectral re-growth of unwanted sidebands.

It is still another object of the present invention to provide a method and apparatus for expanding the dynamic range of power amplifiers operated under large peak-to-average ratios.

Other objects and advantages of the invention will become apparent as the description proceeds.

SUMMARY OF THE INVENTION

The present invention is directed to a method for improving the efficiency and the dynamic range of a power amplifier operated with signals having a large peak-to-average ratio. A reference level is determined, above which at least a portion of the magnitude of an input signal being a modulated signal that is input to the power amplifier, or a baseband waveform that is used to generate the modulated signal, is defined as an excess input signal. The magnitude of the input signal is continuously sampled, for detecting an excess input signal. A lower level of operating voltage is supplied to the power amplifier, if no excess input signal is detected. The lower level of operating voltage is sufficient to effectively amplify input signals having a magnitude below the reference level. A higher level of operating voltage is supplied to the power amplifier, whenever an excess input signal is detected. The higher level of operating voltage is sufficient to effectively amplify input signals having a magnitude above the reference level.

Preferably, an automatic gain control circuit is coupled to the input of the power amplifier, in order to control the magnitude of the input signal(s) prior to amplification. Whenever an excess input signal is detected, the excess input signal is sampled. Changes in the gain of the power amplifier during the presence of the excess input signal are compensated by controlling the gain of the automatic gain control circuit, according to the samples of the excess input signal.

The level of operating voltage is supplied to the power amplifier by a lower voltage source for feeding the power amplifier whenever no excess input signal is detected and a higher voltage source for feeding the power amplifier whenever an excess input signal is detected. The voltage supply contact of the power amplifier is connected to the lower voltage source through a first variable impedance, and may be connected to the higher voltage source through a second variable impedance. Whenever no excess input signal is detected, the first and the second variable impedances may be simultaneously controlled to be in an appropriate low, and highest impedance states, respectively. Whenever an excess input signal is detected, the first and the second variable impedances may be simultaneously controlled to be in their highest and an appropriate low impedance states, respectively.

Preferably, the level of operating voltage is supplied to the power amplifier by using another voltage source for feeding the power amplifier whenever an excess input signal is detected. The voltage supply contact of the power amplifier is connected to the first voltage source through a variable impedance, and to the another voltage source through a voltage amplifier. The variable impedance can present a low resistance to DC and high impedance for rapidly varying pulses. The variable impedance is allowed to reach an appropriate low resistance whenever no excess input signal is detected, and its high impedance whenever an excess input signal is detected. The voltage amplifier is allowed to supply a voltage level that is higher than the voltage of the first voltage source, to the voltage supply contact of the power amplifier, whenever an excess input signal is detected. At least one of the variable impedances may be an inductor or a diode, or a controllable impedance, such as a bipolar transistor or a FET.

Preferably, levels of operating voltage, supplied to the power amplifier, are normalized to corresponding predetermined levels of the excess input signal. The level of operating voltage supplied to the power amplifier sampled and an error signal is generated by comparing between the sampled level with the excess input signal. The error signal is used to operate a negative feedback loop for accurately controlling the operating voltage supplied to the power amplifier.

Alternatively, levels of operating voltage, supplied to the power amplifier, are normalized to corresponding predetermined levels of RF output signals, amplified by the power amplifier. The level of RF output signals, amplified by the power amplifier is sampled and an error signal is generated by comparing between the sampled level with the excess input signal. The error signal is used for operating a negative feedback loop for accurately controlling the operating voltage supplied to the power amplifier.

According to another aspect of the invention, the level of DC voltage, supplied to the power amplifier, is controlled, using the baseband waveform. A baseband signal source outputs the baseband waveform into a modulator, that generates a modulated input signal, which is fed into the power amplifier. A reference level, above which at least a portion of the baseband waveform, is defined as an excess baseband signal is determined. The magnitude of the baseband waveform is continuously sampled, for detecting an excess baseband signal. A lower level of operating voltage is supplied to the power amplifier, if no excess baseband signal is detected. The lower level of operating voltage is sufficient to effectively amplify input signals, modulated with a baseband waveform of a magnitude below the reference level. A higher level of operating voltage is supplied to the power amplifier, whenever an excess baseband signal is detected. The higher level of operating voltage is sufficient to effectively amplify input signals that are modulated with a baseband waveform of a magnitude above the reference level.

According to a further aspect of the invention, the power amplifier may be the auxiliary amplifying circuitry of a Doherty configuration that consists of an auxiliary amplifier directly connected to the load, and a main amplifier coupled to said load through a Doherty coupler. A reference level is determined, above which at least a portion of the magnitude of an input signal being a modulated signal that is input to said power amplifier, or a baseband waveform that is used to generate the modulated signal, is defined as an excess input signal such that the reference level is essentially equal to the level of the input signal that causes the main and the auxiliary amplifier circuitries to output essentially the same power into the load, thereby reaching the maximal output power level under said DC operating voltage. The magnitude of the input signal is continuously sampled, for detecting an excess input signal. The input signal is continuously amplified with the main amplifier circuitry by supplying a constant operating voltage to said main amplifier circuitry. As long as no excess voltage is detected, the input signal is amplified by the auxiliary amplifier circuitry by supplying, to the auxiliary amplifier, the same DC operating voltage that is supplied to the main amplifier. Whenever an excess voltage is detected, an enhanced and higher level of DC operating voltage is supplied to the auxiliary amplifying circuitry. The enhanced level of operating voltage is sufficient to effectively amplify input signals having magnitude above the reference level.

The present invention is also directed to an apparatus for improving the efficiency and the dynamic range of a power amplifier operated with signals having a large peak-to-average ratio. The apparatus comprises a sampling circuit for continuously sampling the magnitude of an input signal, which may be a modulated signal that input to the power amplifier, or of a baseband waveform that is used to generate the modulated signal. The sampling circuit detects an excess input signal according to a predetermined reference level, above which at least a portion of the input signal is defined as an excess input signal; a power supply for indirectly supplying an operating voltage to the power amplifier; and a control circuit that operates in combination with the power supply, for causing the power supply to supply a lower level of operating voltage that is sufficient to effectively amplify input signals of a magnitude below the reference level, to the power amplifier, if no excess input signal is detected, and to supply a higher level of operating voltage that is sufficient to effectively amplify input signals of a magnitude above the reference level, to the power amplifier, whenever an excess input signal is detected.

The apparatus may further comprise:
a) an automatic gain control circuit, coupled to the input of the power amplifier, for controlling the magnitude of the input signal(s) prior to amplification;
b) circuitry for sampling the excess input signal; and
c) a control circuitry, for compensating changes in the gain of the power amplifier during the presence of the excess input signal by controlling the gain of the automatic gain control circuit, according to the samples of the excess input signal.

The apparatus may comprise:
a) a lower voltage source for feeding the power amplifier whenever no excess input signal is detected;
b) a higher voltage source for feeding the power amplifier whenever an excess input signal is detected;
c) a first variable impedance connected between the voltage supply input of the power amplifier and the lower voltage source;
d) a second variable impedance connected between the voltage supply input of the power amplifier and the higher voltage source; and e) a control circuit for simultaneously controlling the first and the second variable impedances to be in an appropriate low, and highest impedance states, respectively, whenever no excess input signal is detected, and to be in their highest, and an appropriate low impedance states, respectively, whenever an excess input signal is detected.

Preferably, the apparatus comprises:
a) a first voltage source for feeding the power amplifier whenever no excess input signal is detected;
b) another voltage source for feeding the power amplifier whenever an excess input signal is detected;
c) a variable impedance connected between the voltage supply contact of the power amplifier and the first voltage source, the variable impedance being capable of presenting a low resistance to DC and high impedance for rapidly varying pulses;
d) a voltage amplifier connected between the voltage supply contact of the power amplifier and the another voltage source, for supplying a voltage level, being higher than the voltage of the first voltage source, to the voltage supply contact of the power amplifier;
e) a control circuit, for controlling the voltage amplifier to supply a voltage level, being higher than the voltage of the first voltage source, to the voltage supply contact of the power amplifier, whenever no excess input signal is detected, and if the variable impedance is a controllable impedance:
  for controlling the variable impedance to reach its high impedance value whenever an excess input signal is detected, and to reach an appropriate low resistance whenever no excess input signal is detected.

At least one of the variable impedances of the apparatus may be an inductor or a diode, or a controllable impedance, such as a bipolar transistor or a FET. The apparatus may further comprise:
a) a sampling circuit for sampling the level of operating voltage supplied to the power amplifier;
b) a comparator for generating an error signal by comparing between the sampled level of operating voltage supplied to the power amplifier, with the level of the excess input signal; and
c) a negative feedback loop for accurately controlling the operating voltage supplied to the power amplifier, by using the error signal.

The apparatus may further comprise:
a) a sampling circuit for sampling the level of RF output signals, amplified by the power amplifier;
b) a comparator for generating an error signal by comparing between the sampled level of RF output signals, amplified by the power amplifier, with the level of the excess input signal; and
c) a negative feedback loop for accurately controlling the operating voltage supplied to the power amplifier, by using the error signal.

Alternatively, the apparatus may further comprise:
a) a modulator for generating a modulated signal that is input to the power amplifier;
b) a baseband signal source for generating a baseband waveform that that is input to the modulator;
c) a sampling circuit for continuously sampling the magnitude of the baseband waveform, for detecting an excess input signal according to a predetermined reference level, above which at least a portion of the baseband waveform is defined as an excess baseband signal;
d) a power supply for indirectly supplying an operating voltage to the power amplifier; and
e) a control circuit, operating in combination with the power supply, for causing the power supply to supply a lower level of operating voltage being sufficient to effectively amplify input signals having a magnitude below the reference level, to the power amplifier, if no excess input signal is detected, and to supply a higher level of operating voltage being sufficient to effectively amplify input signals having a magnitude above the reference level, to the power amplifier, whenever an excess input signal is detected.

The apparatus may be connected to a power amplifier being the auxiliary amplifying circuitry that is used in the Doherty configuration, such that the output of said auxiliary amplifying circuitry is directly connected to a load and is operated in combination with a main amplifier that is coupled to said load through a Doherty coupler. The input of said auxiliary amplifying circuitry is coupled to the input of said main amplifier through a phase shifting circuitry that has essentially similar phase shift to the phase shift that introduced by said Doherty coupler.

BRIEF DESCRIPTION OF THE DRAWINGS

The above and other characteristics and advantages of the invention will be better understood through the following illustrative and non-limitative detailed description of preferred embodiments thereof, with reference to the appended drawings, wherein.

DETAILED DESCRIPTION OF PREFERRED EMBODIMENTS

Figure 1A:
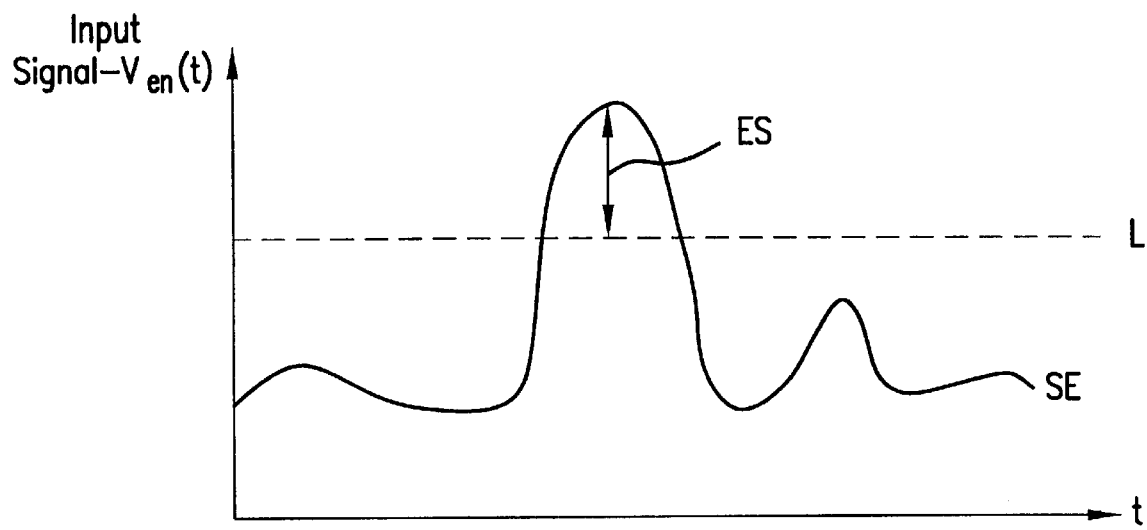
FIGS. 1A and 1B schematically illustrate the waveform of the input signal to the power amplifier and the desired waveform of the supply voltage to the power amplifier, respectively, according to a preferred embodiment of the invention.
Figure 1B:
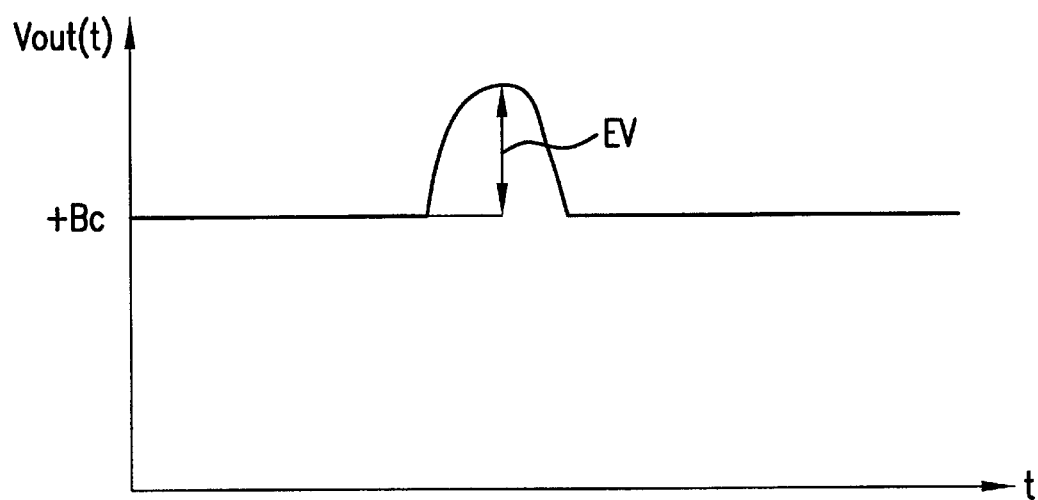

FIGS. 1A and 1B schematically illustrate the waveform of the input signal to the power amplifier and the desired vaveform of the supply voltage to the power amplifier, respectively, according to a preferred embodiment of the invention. The waveform $v_{en}(t)$ in FIG. 1A illustrates the positive envelope of an input RF signal, input to the power amplifier. An Excess Signal (ES) occurs when the level of the Signal Envelope (SE) exceeds a predetermined Reference Level (L) defined by the system designer. The present invention provides a circuitry called Voltage Enhancement (VE) Circuitry (VEC), described further below, that causes the supply voltage to the RF amplifier to have the desired waveform, as shown in FIG. 1B: The supply voltage normally remains in a constant value, $+B_C$, (the subscript C for "conventional") and is varied (enhanced) only during the anomalous periods when the level of the input signal is higher than the predetermined Reference Level (L) (i.e., there is an ES). The resulting enhanced voltage (EV) waveform is a close replica of the ES waveform, as indicated by comparing between FIGS. 1A and 1B.

Figure 2A:
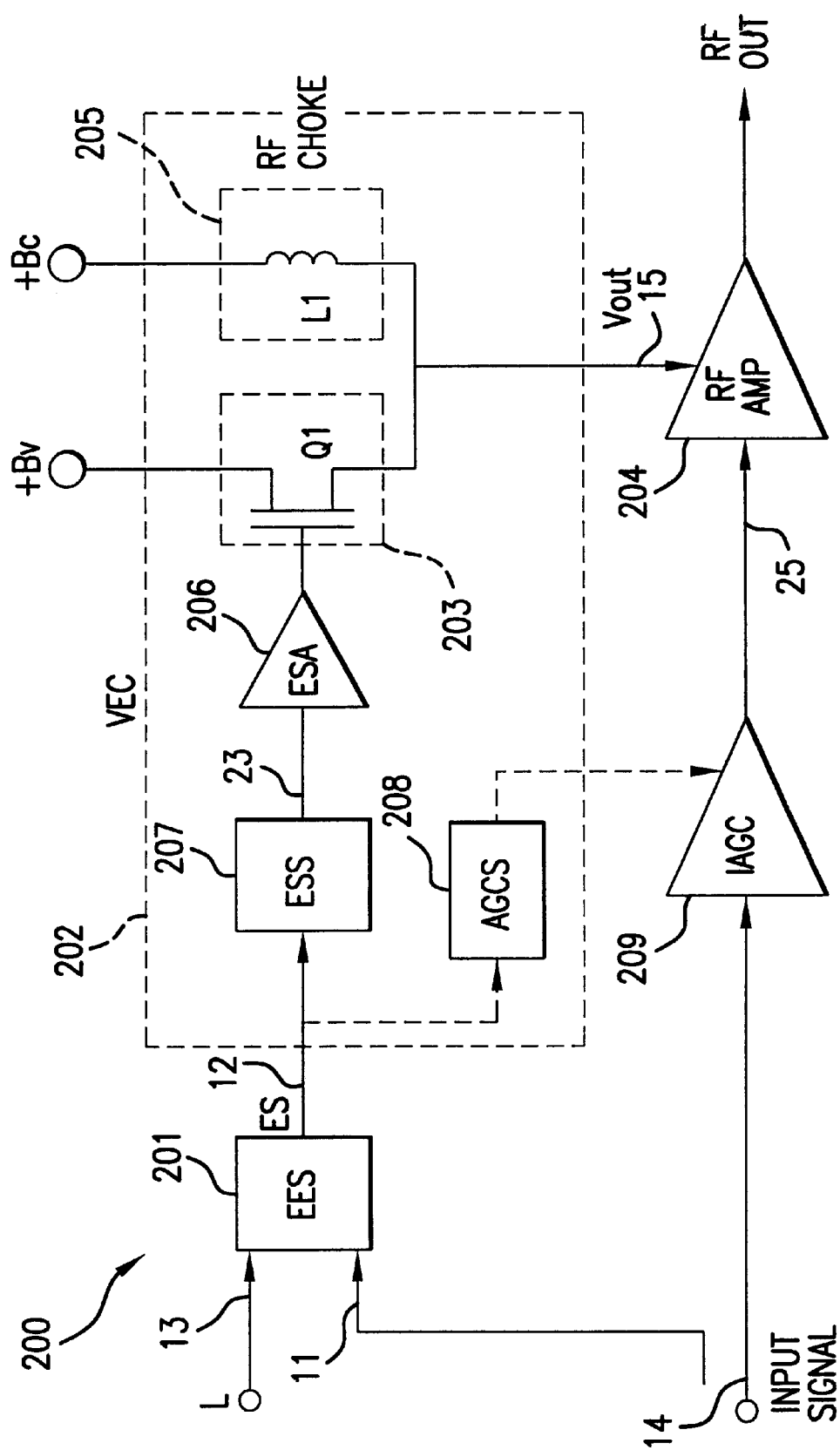
FIG. 2A is a block diagram of the basic circuit for controlling the supply voltage to the power amplifier, according to a preferred embodiment of the invention.

FIG. 2A is a block diagram of the basic circuit for controlling the supply voltage to the power amplifier, according to a preferred embodiment of the invention. The circuit 200 comprises an Excess Envelope Sensor (EES) 201, a VEC 202, RF stages 209, 204 and an input coupler at point 14. The RF power amplifier 204 is designed such that when there is no excess signal ES at point 12, the DC supply $+B_C$ is sufficient to amplify the modulated RF signal at point 25 with the required fidelity. However, when signal 25 reaches peak values, the RF power amplifier 204 would be saturated if the voltage $+B_C$ is supplied. Such peaks are sensed by the EES 201 that outputs the excess signal ES at point 12 resulting from these peaks, to the VEC block 202 which, in turn, appropriately enhances the voltage $v_{out}(t)$ (that appears at point 15), fed to the RF power amplifier 204. This is indeed, the enhanced voltage EV, introduced in FIG. 1B. Therefore, the RF power amplifier 204 with the enhanced supply voltage remains unsaturated when the input RF signal peaks occur, and the amplification remains adequate.

The EES 201 detects an ES by sampling the RF signal at the input 14, and comparing the sample that appears at input 11 of EES 201 to the reference level L that appears at input 13 of EES 201. EES 201 outputs the excess signal (ES) at point 12. The ES is then input to the VEC block 202, which is configured such that it outputs the desired supply voltage $v_{out}(t)$ (shown in FIG. 1B) at point 15, to the RF amplifier 204. During normal periods when there is no ES at point 12, the Analog Power Valve (APV) 203 is essentially in cut-off and the VE LOAD block 205 introduces a low DC resistance. Thus, the DC voltage $+B_C$ at point 16 is fully applied to the RF amplifier 204. In this state, $v_{out}=+B_C$, as indicated also in FIG. 1B above. On the other hand, the VE LOAD block 205 provides a high impedance to a positive pulse, such as a voltage enhancement pulse that is supplied by the Analog Power Valve (APV) 203 when the latter is excited by an ES. According to a preferred embodiment of the invention, the VE LOAD block 205 can be implemented using either an RF choke L1, or a diode with its anode connected to a voltage $+B_C$, or a voltage controlled transistor (such as a Field-Effect-Transistor (FET), or a bipolar transistor).

The APV block 203 can be implemented as a transistor, for example a Field-Effect Transistor (FET) Q1, or a bipolar transistor, and be conveniently biased to be normally in the cut-off state, except when excited by the output of the Excess Signal Amplifier (ESA) 206. The APV block 203 may be powered from a separate DC voltage source, $B_v$. The optional Excess Signal Shaper (ESS) 207 that translates the ES to the input of ESA 206, is a memory-less, monotonic non-linearity. The purpose of ESA 206 is to output, at point 23, an altered shape of the Excess Signal that appears at point 12, in order to counteract possible non-linearities incurred in the APV block 203 and in the characteristics of the RF amplifier 204.

According to a preferred embodiment of the invention, the excess signal (ES) output at point 12 may also be used to adjust the overall gain of the RF chain during effectuation of the voltage enhancement (VE), for improved fidelity. Such option is shown by the dotted lines in FIG. 2A. The ES is appropriately conditioned by the AGC Shaper (AGCS) block 208, and then applied to control the gain of the instantaneous automatic gain control (IAGC) stage 209. The AGCS block 208, very much like the ESS 207, is also a memory-less monotonic nonlinearity. The concept behind the two shapers ESS 207, and AGCS 208 is the following: Basically, the voltage enhancement of the RF amplifier 204 is intended to increase its dynamic range. However, such VE will, to a certain extent, also increase the gain of the RF amplifier 204. The IAGC stage 209 is used to compensate the gain changes by decreasing its own gain accordingly. The transfer functions of the ESS 207 and the AGCS block 208 can be adjusted for linearity of gain, while the dynamic range is extended during the voltage enhancement period.

Figure 2B:
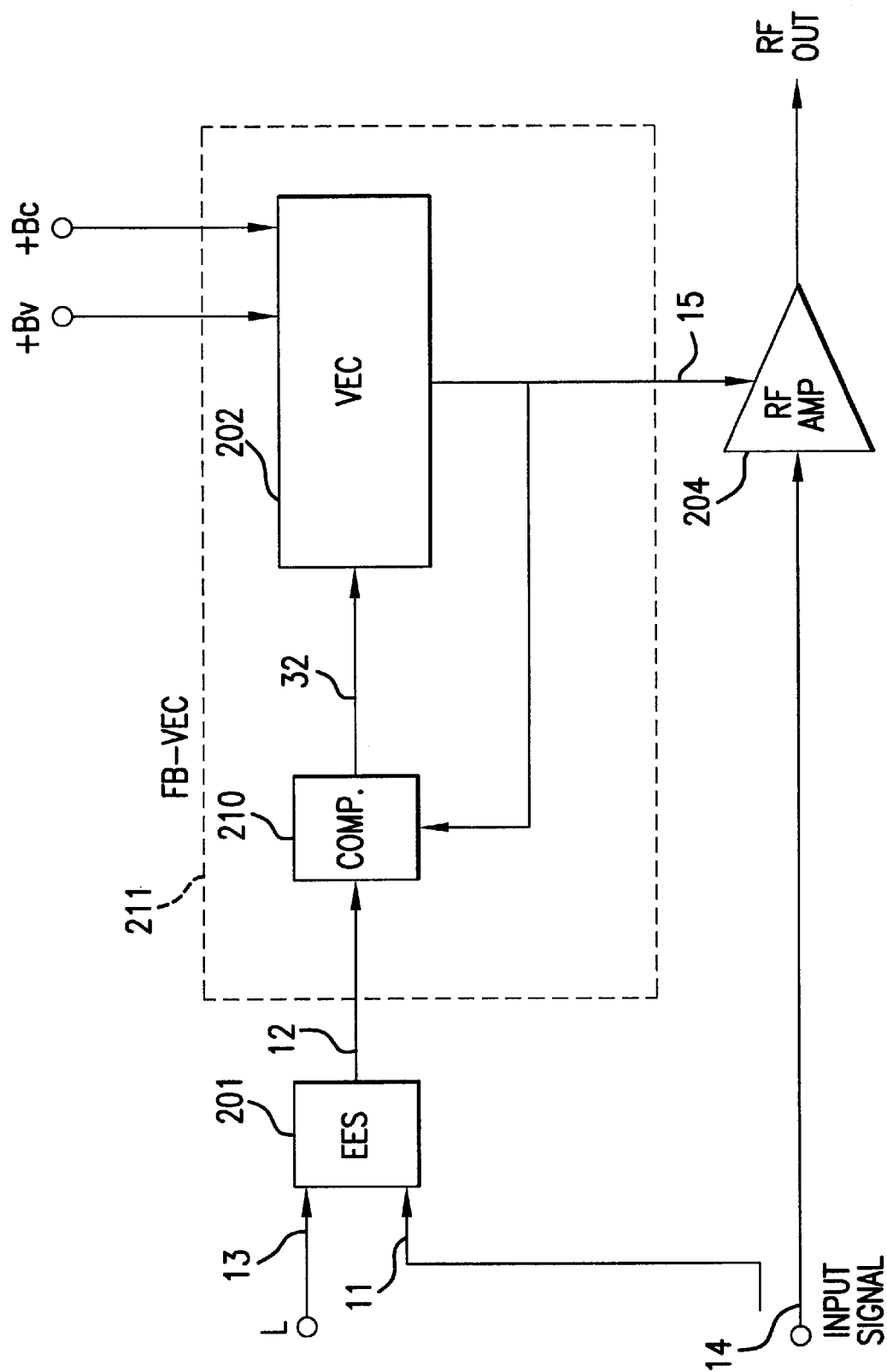
FIG. 2B is a block diagram of a circuit for controlling the enhanced supply voltage to the power amplifier by feeding back part of the enhanced voltage, according to a preferred embodiment of the invention.

FIG. 2B is a block diagram of a circuit for controlling the enhanced supply voltage to the power amplifier by feeding back part of the enhanced voltage, according to a preferred embodiment of the invention. By using this option, it is possible to obtain better fidelity than by using the Excess Signal Shaper (ESS) block 207 alone, as shown in FIG. 2A hereinabove. A comparator 210 compares the output voltage $v_{out}(t)$ that appears at point 15, with the ES that appears at point 12. The difference voltage that appears at point 32 is fed into the VEC 202. This constitutes a modified Feed Back VEC (FB-VEC) indicated by the reference numeral 211 in FIG. 2B. Depending on the plurality of said difference voltage, the voltage amplification of the VEC 202 will either be increased or decreased, until the EV will track the ES.

Figure 2C:
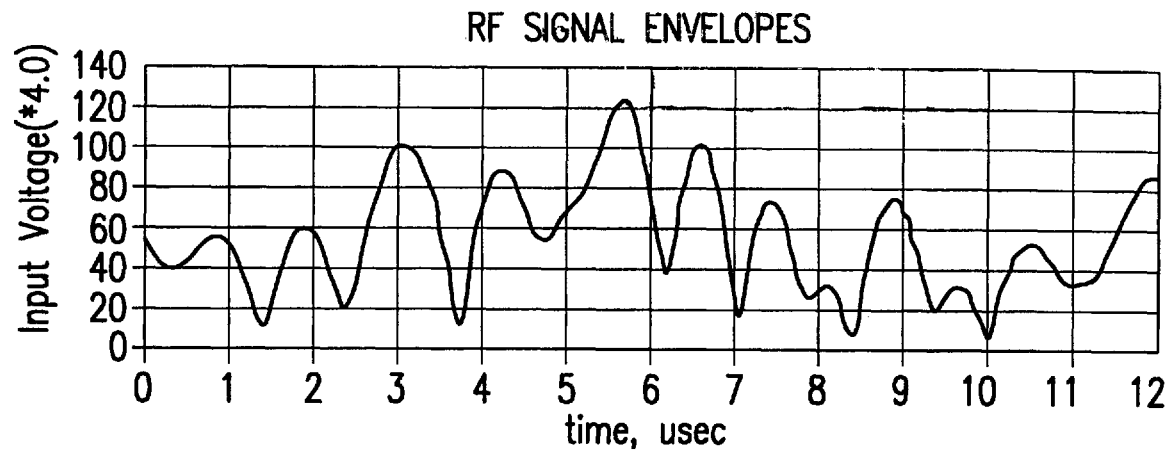
FIGS. 2C to 2E schematically illustrate computed simulated results of the supplied voltage with and without Excess Signal (ES) feedback, according to a preferred embodiment of the invention.
Figure 2D:
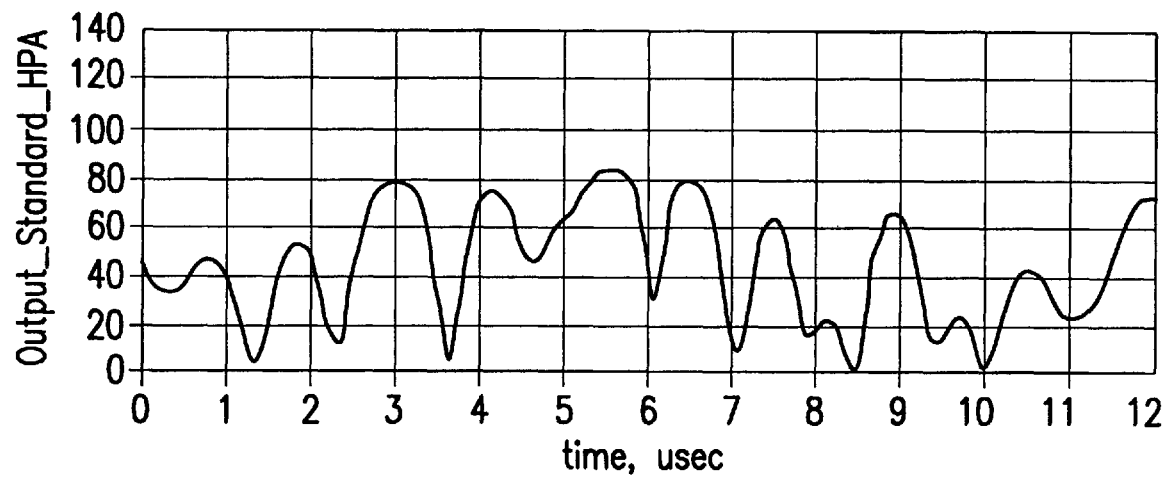
Figure 2E:
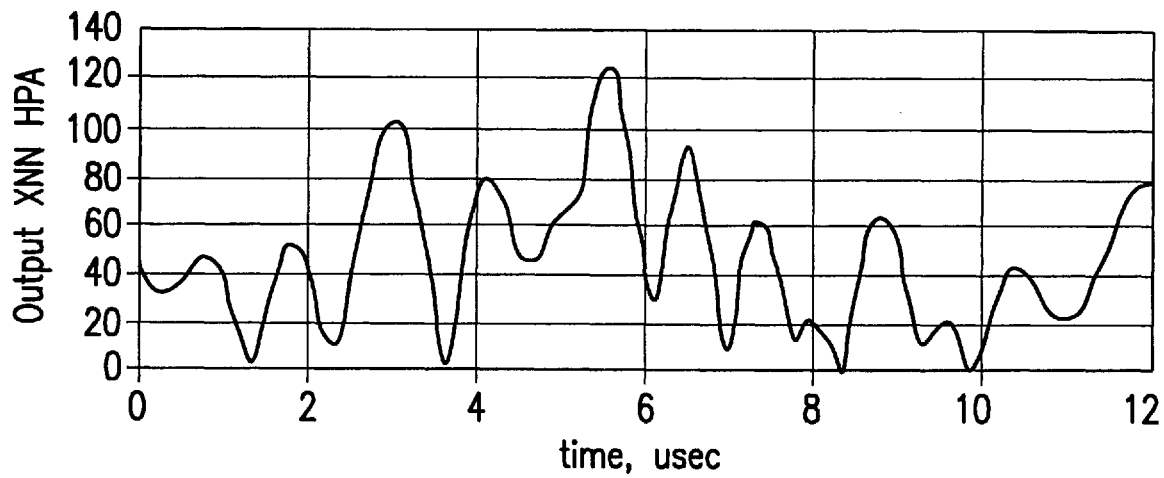

FIGS. 2C to 2E schematically illustrates computer-simulated results of a conventional amplifier and of the FB-VEC of FIG. 2B, according to a preferred embodiment of the invention. The upper graph (FIG. 2B) shows the waveform of the envelope of the input signal to the RF amplifier 204 that is composed of nine channels of a CDMA signal (scaled by 3.6). The other graphs (FIGS. 2D and 2E) show the envelope of the output from the RF amplifier 204. The middle graph (FIG. 2D) shows a conventional situation, when the VEC is disabled and only the voltage $+B_C$ is supplied. Severe distortion of outputs above 80 Volts is noticeable. The lower graph (FIG. 2E) shows the situation when the FB-VEC 211 (shown in FIG. 2B) is operated. In the lower graph, the fast tracking of the change in the envelope amplitude above values of 80 Volts is noteworthy.

Figure 3:
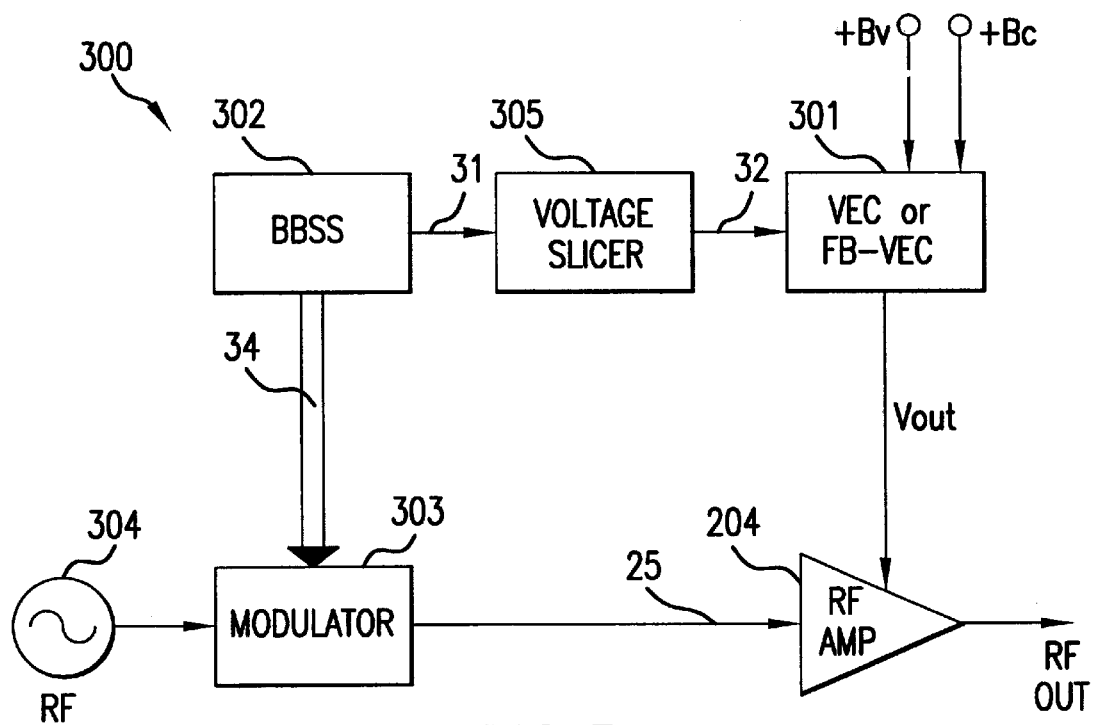
FIG. 3 is a block diagram of a circuit for controlling the supply voltage to the power amplifier when there is access to baseband signals, according to a preferred embodiment of the invention.

FIG. 3 is a block diagram of a circuit for controlling the supply voltage to the power amplifier when there is access to baseband signals, according to a preferred embodiment of the invention. The circuit 300 employs a VEC block 301, which may be either the basic VEC 202 without feedback (shown in FIG. 2B), or the FB-VEC (shown in FIG. 2B). The circuit 300 is implemented with access to the amplitude value of the Base Band Signal Source (BBSS) 302, at point 31. The RF power amplifier 204 should amplify RF signals with large peaks above its average value, as obtained from the Base Band Signal Source 302. The BBSS 302 outputs complex signals at point 34, which are input to an appropriate modulator 303 that is also fed by an RF sinewave from an RF oscillator 304. The BBSS 302 feeds the amplitude information that appears at point 31 into the Voltage Slicer 305. The Voltage Slicer 305 performs the same operation on a Base Band Signal, as the EES block 201 performs on an input RF signal: It extracts an excess signal ES at point 32 when the amplitude at point 31 exceeds the reference level L. The operations that follow are exactly as shown in FIG. 2A above.

Figure 4:
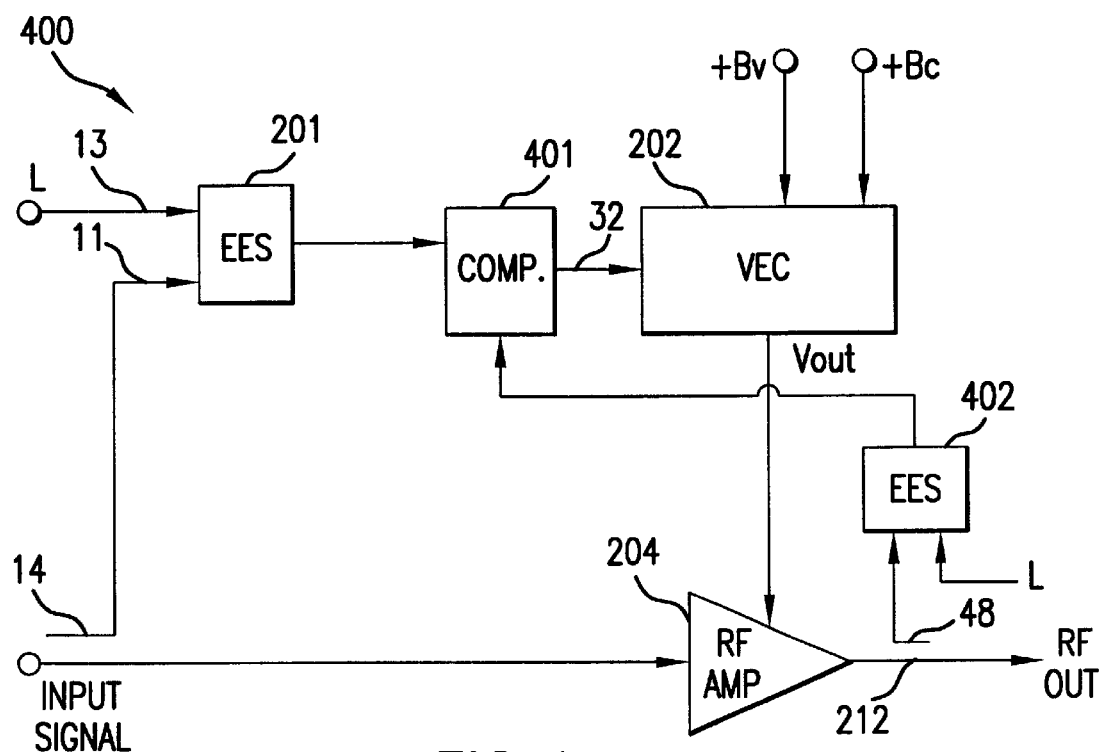
FIG. 4 is a block diagram of a circuit for controlling the supply voltage to the power amplifier with an output control, according to a preferred embodiment of the invention.

FIG. 4 is a block diagram of a circuit for controlling the enhanced supply voltage to the power amplifier by feeding back part of the RF amplifier output signal, rather than part of the EV, as shown in FIG. 2B. The circuit 400 is a refinement of the FB-VEC block 211, shown in FIG. 2B. Comparator 401 compares the output of the EES 201 with the output of an additional EES 402, that is coupled to the output (point 48) of the RF power amplifier 204, by a coupler 212. As shown in FIG. 2B above, the difference voltage at point 32, that appears at the output of the comparator 401, is fed into the VEC block 202. The fact that in this implementation the feedback loop includes also the RF power amplifier 204 is advantageous, since circuit 400 can potentially correct non-linearities of the RF power amplifier 204, as well.

According to another embodiment of the invention, the VEC is utilized to improve the efficiency of a power amplifier, in which the Doherty configuration is utilized (Doherty configuration is described, for example, in U.S. Pat. No. 2,210,028, and in "RF Power Amplifiers for Wireless Communications", Artech House 1999, pp. 225–239 chapter 8, to Steve C. Cripps).

The Doherty configuration improves the efficiency of a power amplifier (hereinafter the MAIN amplifying circuitry), by introducing an additional amplifying circuitry (hereinafter the AUXILIARY amplifying circuitry), where the outputs of said amplifiers are coupled via a coupling circuitry (so called Doherty coupling). While the MAIN amplifying circuitry is continuously operative, the AUXILIARY amplifying circuitry is activated whenever the value of the input exceeds a predefined threshold (hereinafter called the Doherty threshold). In this fashion, by setting a proper coupling between the outputs of the amplifying circuitries, the operation of the MAIN amplifying circuitry is maintained in a fixed point of operation (i.e. operating with a constant output voltage).

Efficiency is substantially improved by allowing the MAIN amplifying circuitry to operate at its maximal output voltage ($V_{max}$) for all input signals having magnitude above the threshold. At this point of operation, the MAIN amplifier's efficiency is maximal, and this is maintained due to the Doherty coupling. This way, whenever the input signal exceeds a predefined value, the AUXILIARY amplifying circuitry is activated, and boosts the power output up to a factor of 2, without effecting the output voltage of the MAIN amplifying circuitry.

However, the voltage range, in which the Doherty configuration operates, is limited by the value of the threshold utilized to activate the AUXILIARY amplifying circuitry. It is, in fact, limited to approximately twice (factor of 2) the value of said threshold. More particularly, according to the prior art, the Doherty configuration is utilized up to the point where the currents of the MAIN amplifying circuitry and the AUXILIARY amplifying circuitry meet (i.e. the point at which each of the currents is equal to a value of $I_{max}$), and thus it is not a fully satisfactory solution in systems having a large peak-to-average ratio (crest factor).

Figure 6:
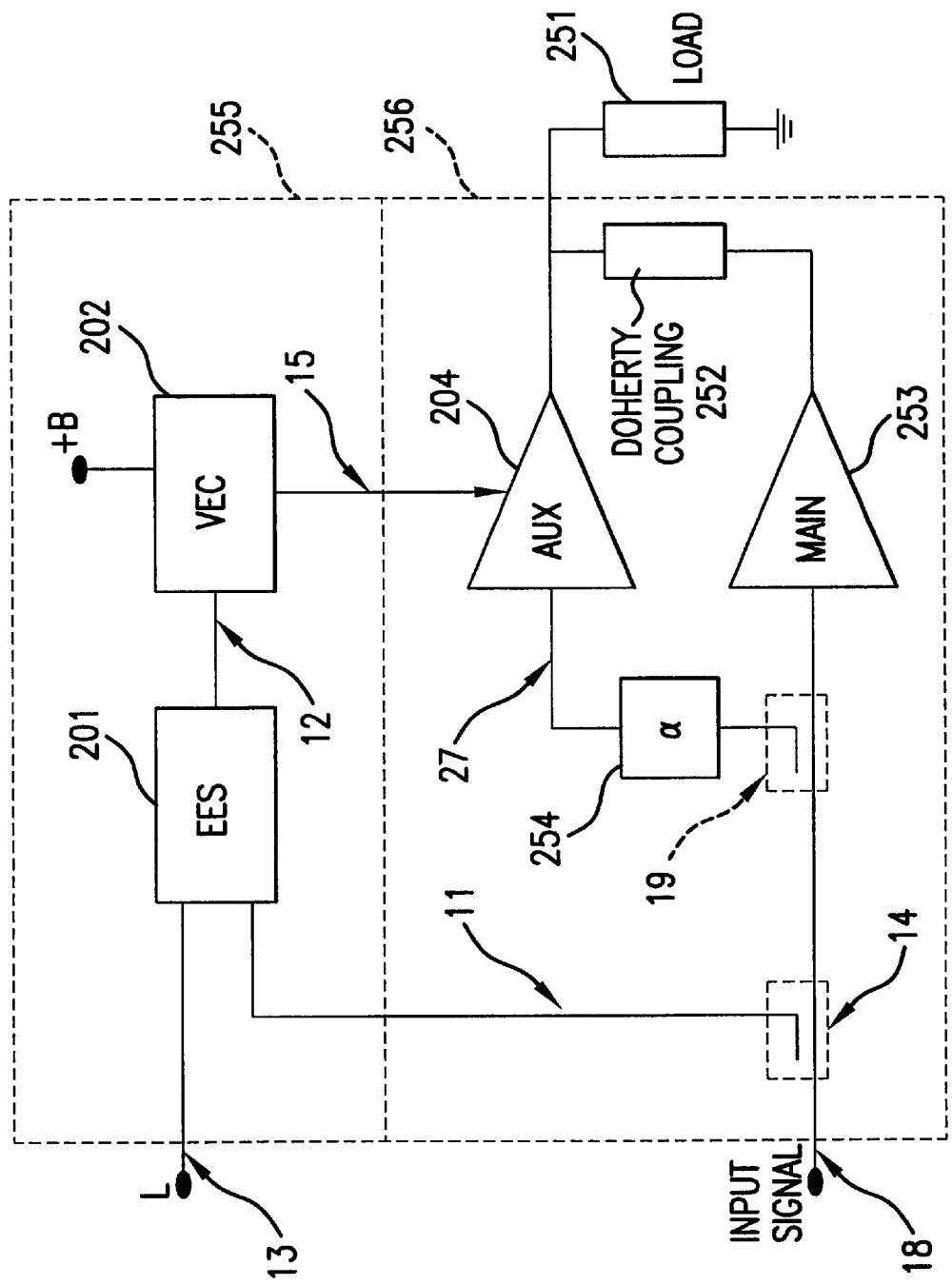
FIG. 6 schematically illustrates a Doherty configuration that comprises a VEC for enhancing the DC supply voltage of its auxiliary amplifying circuitry, according to a preferred embodiment of the invention.

To overcome this limitation (factor of 2), the VEC is utilized, according to a preferred embodiment of the invention, in combination with the Doherty configuration, as schematically illustrated in FIG. 6. The system in FIG. 6 consists of an amplifying unit 256, and another unit 255, for detection of excess envelope signals, and for Voltage Enhancement (VE). The latter is utilized to enhance the power supply of the amplifying unit 256, whenever an excess envelop signal is detected, as will be described in details herein below.

The EES's output 12 drives the Voltage Enhancement Circuitry (VEC) 202, which enhances the power supplied to the amplifying circuitry 256, whenever an excess envelope signal is introduced on its input 12, and operates as an additional power supply to the amplifying circuitry 256. The input signal becomes an excess signal for magnitudes that are greater than the predetermined Reference Level (L). It should be noted that the predetermined Reference Level (L) that activates the voltage enhancement of the VEC 202 is greater that the Doherty threshold.

The amplifying circuitry 256 comprises two amplifiers, a MAIN amplifying circuitry 253, and an AUXILIARY amplifying circuitry 204. Those amplifiers are connected in a Doherty configuration, wherein the MAIN amplifying circuitry 253 is continuously operating, while the AUXILIARY amplifying circuitry 204 is activated only when power enhancement is received from the VEC 202, on 15.

The Doherty configuration is utilized to improve the efficiency, and as was explained hereinbefore, this is achieved by coupling the outputs of the amplifiers, 204 and 253, by the Doherty coupler 252. The functioning of the Doherty coupler 252 acts to reduce the impedance of the Load, as "seen" by the MAIN amplifying circuitry 253, as the value of the input signal 18 increases. This way, the power output is increased while keeping the output voltage of the MAIN amplifying circuitry constant. A Doherty configuration 256 is utilized to produce output voltage which exceeds the typical output voltage $V_{max}$, of the MAIN amplifying circuitry. The Doherty configuration is typically designed such that the AUXILIARY amplifying circuitry is activated to increase the output power whenever the input signal 18 exceeds an average input value. The voltage of the MAIN amplifying circuitry 253 typically reaches its maximal output voltage ($V_{max}$) when the AUXILIARY amplifying circuitry is activated. Increasing the input signal above the average input value will result in increasing the output voltage of the AUXILIARY amplifying circuitry, and also of the currents of both, the MAIN and AUXILIARY amplifiers.

The Doherty coupling circuitry 252 has a phase constant (i.e., a delay), typically of $\pi/2$. Thus, the output voltages of the amplifying circuitries, 204 and 253, may have a phase difference, unless a compensating circuitry 254 is introduced at the input of one (or both of) the amplifying circuitries, 204 and 253. These compensating circuitry 254 affects the inputs of the amplifying circuitries, 204 and 253, to eliminate the phase difference caused by the coupling circuitry 252. The input of said compensating circuitry 254 is coupled from the input signal on 18 by utilizing a coupling circuitry 19.

However, the output voltage and the currents of the amplifiers are limited in the Doherty configuration. Typically, the output voltage of the AUXILIARY amplifying circuitry may be increased up to $V_{max}$, and the currents of the MAIN and AUXILIARY amplifying circuitries may be increased up to $I_{max}$ each. According to the invention, the output voltage of the AUXILIARY amplifying circuitry, and the currents of both MAIN and AUXILIARY amplifying circuitries, in the Doherty configuration may now exceed the values of $V_{max}$ and $I_{max}$, respectively, by utilizing the VEC to enhance the voltage supply to the AUXILIARY amplifying circuitry 204.

Figure 5:
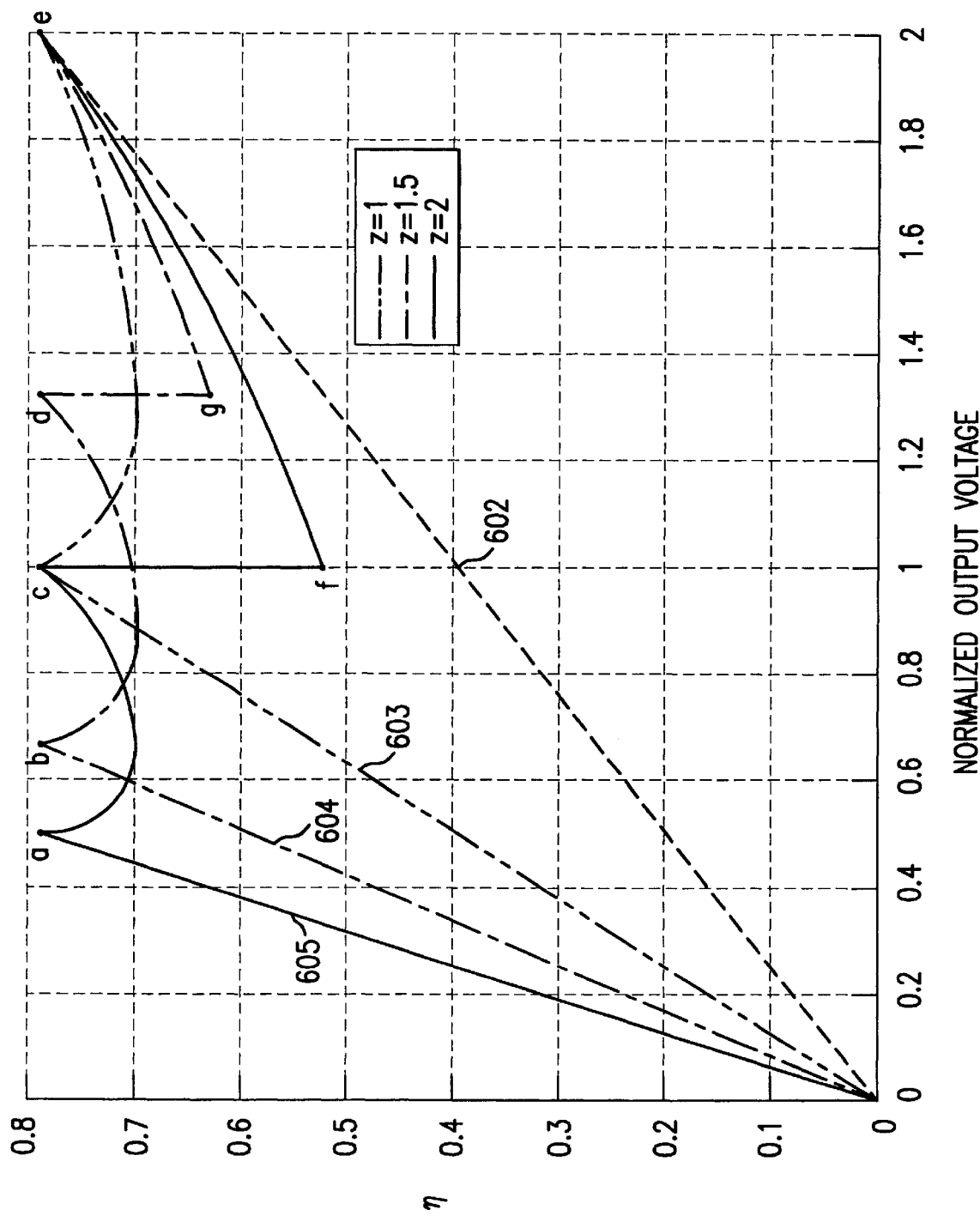
FIG. 5 graphically illustrates analysis results of the expected improvement in efficiency, by utilizing the VEC in combination with the Doherty configuration.

FIG. 5 illustrates the expected efficiency η versus the normalized output voltage at the load, as analyzed for various voltage enhancement values, according to a preferred embodiment of the invention. The curve 602 illustrates the linear efficiency achieved by a conventional Class B amplifier. As illustrated by curve 603, the efficiency is substantially improved when the Doherty configuration is conventionally utilized. The efficiency is further improved when the VEC 202 is utilized for enhancing the voltage supplied to the AUXILIARY. amplifying circuitry of the Doherty configuration such that the voltage across the load increases beyond $V_{max}$, depending on the enhancement factor Z (the enhancement factor Z is defined as the ratio between the level of DC voltage that is supplied to a power amplifier for the maximal value of the excess input signal, and the level of DC voltage that is supplied to said power amplifier in the absence of an excess input signal). Curves 603, 604 and 605 illustrate the operation of the Doherty configuration for enhancement factors of Z=1 (no enhancement), Z=1.5 and Z=2, respectively. If $V_{max}$ represents the maximum voltage across the load for a conventional Doherty configuration, in FIG. 5 curve 603 is normalized to $0.5V_{max}$, curve 604 is normalized to $0.66V_{max}$) and curve 603 is normalized to $V_{max}$.

In curve 603, point c represents the normalized voltage across the load for which the AUXILIARY amplifying circuitry begins to be active, and point e represents the normalized voltage across the load for which the AUXILIARY amplifying circuitry is fully active and contributes its maximum power to the load, without enhancement. In this case (with Z=1), the maximum voltage that can be obtained across the load is $V_{max}$.

In curve 604, point b represents the normalized voltage across the load for which the AUXILIARY amplifying circuitry begins to be active, and point d represents the normalized voltage across the load for which the AUXILIARY amplifying circuitry is fully active and contributes its maximum power to the load, without enhancement. At this point d the maximum voltage that can be obtained across the load is $V_{max}$. When an enhancement factor of Z=1.5 is applied, the efficiency η increases from point g, along the curve to point e. In this case, the maximum voltage that can be obtained across the load for Z=1.5 is $1.33V_{max}$.

In curve 605, point a represents the normalized voltage across the load for which the AUXILIARY amplifying circuitry begins to be active, and point c represents the normalized voltage across the load for which the AUXILIARY amplifying circuitry is fully active and contributes its maximum power to the load, without enhancement. At this point c the maximum voltage that can be obtained across the load is $V_{max}$. When an enhancement factor of Z=2 is applied, the efficiency η increases from point f, along the curve to point e. In this case, the maximum voltage that can be obtained across the load for Z=2 is $2V_{max}$. Therefore, the enhancement of the voltage that is supplied to the AUXILIARY amplifying circuitry of the Doherty configuration allows obtaining output voltage levels, across the load, which are higher than $V_{max}$, (which of course, resulting in higher output power) depending on the value of the enhancement factor Z.

The above examples and description have of course been provided only for the purpose of illustration, and are not intended to limit the invention in any way. As will be appreciated by the skilled person, the invention can be carried out in a great variety of ways, employing more than one technique from those described above, all without exceeding the scope of the invention.

What is claimed is:

1. A method for improving the efficiency and the dynamic range of a power amplifier operated with signals having a large peak-to-average ratio, comprising:
   a) providing an auxiliary amplifying circuitry of a Doherty configuration and a main amplifier, said main amplifier and said auxiliary amplifying circuitry comprising said power amplifier;
   b) determining a reference level, above which at least a portion of the magnitude of an input signal being a modulated signal that is input to said power amplifier, or a baseband waveform that is used to generate said modulated signal, is defined as an excess input signal;
   c) continuously sampling said magnitude of said input signal, for detecting an excess input signal;
   d) if no excess input signal is detected, supplying a constant level of operating voltage to said power amplifier, said constant level of operating voltage being sufficient to effectively amplify input signals having a magnitude below said reference level; and
   e) whenever the excess signal is detected, concurrently supplying a variable level of operating voltage to said power amplifier, said level of operating voltage essentially tracking the magnitude of said excess input signal with use of analog circuitry, thereby supplying, to said power amplifier, a variable increased level of operating voltage being sufficient to effectively amplify input signals having a magnitude above said reference level.

2. A method according to claim 1, wherein the level of DC voltage, supplied to the power amplifier, is controlled, using the baseband waveform, by performing the following steps:
   a) providing a modulator, fed by a baseband signal source that outputs said baseband waveform, for generating a modulated input signal to said power amplifier;
   b) providing a voltage slicer for extracting an excess signal from the baseband waveform when the magnitude of the baseband waveform exceeds a reference level;
   c) supplying a constant level of operating voltage to said power amplifier, if no excess baseband signal is detected, said lower level of operating voltage being sufficient to effectively amplify input signals, modulated with a baseband waveform having a magnitude below said reference level; and
   d) supplying a variable increased level of operating voltage to said power amplifier, whenever an excess baseband signal is detected, said increased level of operating voltage being sufficient to effectively amplify input signals, modulated with a baseband waveform having a magnitude above said reference level.

3. A method for improving the efficiency and the dynamic range of a power amplifier operated with signals having a large peak-to-average ratio, comprising:
   a) providing an auxiliary amplifying circuitry of a Doherty configuration and a main amplifier, said main amplifier and said auxiliary amplifying circuitry comprising said power amplifier;
   b) determining a reference level, above which at least a portion of the magnitude of an input signal being a modulated signal that is input to said power amplifier, or a baseband waveform that is used to generate said modulated signal, is defined as an excess input signal;

c) continuously sampling said magnitude of said input signal, for detecting an excess input signal;

d) supplying a lower level of operating voltage to said power amplifier, if no excess input signal is detected, said lower level of operating voltage being sufficient to effectively amplify input signals having a magnitude below said reference level;

e) supplying a higher variable level of operating voltage to said power amplifier, whenever an excess input signal is detected, said higher level of operating voltage supplying, to said power amplifier, a level of operating voltage being sufficient to effectively amplify input signals having a magnitude above said reference level;

f) coupling an automatic gain control circuit to the input of said power amplifier, for controlling the magnitude of said input signal(s) prior to amplification;

g) whenever an excess input signal is detected, sampling said excess input signal; and h) compensating changes in the gain of said power amplifier during the presence of said excess input signal by controlling the gain of said automatic gain control circuit, according to the samples of said excess input signal.

4. A method according to claim 3, wherein the level of operating voltage is supplied to the power amplifier by performing the following steps:

a) providing a first voltage source for feeding said power amplifier;

b) providing a second voltage source for additionally feeding said power amplifier whenever an excess input signal is detected;

c) connecting the voltage supply contact of said power amplifier to said second voltage source through a variable impedance;

d) whenever no excess input signal is detected, controlling said variable impedance to be in its highest impedance state; and e) whenever an excess input signal is detected, controlling said variable impedance to be in a low impedance state, said low impedance state being essentially equal to the value required to increase said second voltage source to a level capable of tracking the magnitude of said excess input signal.

5. A method according to claim 3, wherein the level of operating voltage is supplied to the power amplifier by performing the following steps:

a) providing a first voltage source for feeding said power amplifier whenever no excess input signal is detected;

b) providing another voltage source for feeding said power amplifier whenever an excess input signal is detected;

c) connecting the voltage supply contact of said power amplifier, to said first voltage source through a variable impedance, and to said another voltage source through a voltage amplifier, said variable impedance being capable of presenting a low resistance to DC and high impedance for rapidly varying pulses;

d) whenever no excess input signal is detected, allowing said variable impedance to reach its lowest resistance; and e) whenever an excess input signal is detected, allowing said variable impedance to reach its high impedance, and allowing said voltage amplifier to supply a voltage level, being higher than the voltage of said first voltage source, to said voltage supply contact of said power amplifier.

6. A method according to claim 4, wherein at least one of the variable impedances is a controllable impedance.

7. A method according to claim 4, wherein the variable impedance is an inductor or a diode.

8. A method according to claim 6, wherein the controllable impedance is a bipolar transistor or a FET.

9. A method according to claim 3, further comprising:

a) normalizing levels of operating voltage, supplied to said power amplifier, to corresponding predetermined levels of the excess input signal;

b) sampling the level of operating voltage supplied to said power amplifier;

c) generating an error signal by comparing between the sampled level with said excess input signal; and d) using said error signal for operating a negative feedback loop for accurately controlling the operating voltage supplied to said power amplifier.

10. A method according to claim 3, further comprising:

a) normalizing levels of the excess input signal to corresponding predetermined levels of RF output signals, amplified by said power amplifier;

b) sampling the level of RF output signals, amplified by said power amplifier;

c) generating an error signal by comparing between the sampled level with said excess input signal; and d) using said error signal for operating a negative feedback loop for accurately controlling the operating voltage supplied to said power amplifier.

11. A method according to claim 4, wherein a common power supply provides both the first and second voltage sources, the voltage being supplied by the second voltage source having an essentially identical value, or a lower value, as provided in steps (a) and (b) of claim 3.

12. Apparatus for improving the efficiency and the dynamic range of a power amplifier operated with signals having a large peak-to-average ratio, comprising:

a) a main amplifier;

b) an auxiliary amplifying circuitry of a Doherty configuration, said main amplifier and said auxiliary amplifying circuitry comprising said power amplifier;

c) a sampling circuit for continuously sampling the magnitude of an input signal being a modulated signal that is input to said power amplifier, or of a baseband waveform that is used to generate said modulated signal, for detecting an excess input signal according to a predetermined reference level, above which at least a portion of said input signal is defined as the excess input signal;

d) a power supply for supplying an operating voltage to said power amplifier; and e) an analog control circuit, operating in combination with said power supply, for causing said power supply to supply a constant level of operating voltage being sufficient to effectively amplify input signals having a magnitude below said reference level, to said power amplifier, if no excess input signal is detected, and to concurrently supply to said power amplifier, whenever an excess input signal is detected, a variable increased level of operating voltage that essentially tracks the magnitude of said excess input signal and is sufficient to effectively amplify input signals having a magnitude above said reference level.

13. Apparatus for improving the efficiency and the dynamic range of a power amplifier operated with signals having a large peak-to-average ratio, comprising:

a) a main amplifier;

b) an auxiliary amplifying circuitry of a Doherty configuration, said main amplifier and said auxiliary amplifying circuitry comprising said power amplifier;

c) a sampling circuit for continuously sampling the magnitude of an input signal being a modulated signal that is input to said power amplifier, or of a baseband waveform that is used to generate said modulated signal, for detecting an excess input signal according to a predetermined reference level, above which at least a portion of said input signal is defined as the excess input signal;

d) a power supply for indirectly supplying an operating voltage to said power amplifier;

e) an analog control circuit, operating in combination with said power supply, for causing said power supply to supply a lower level of operating voltage being sufficient to effectively amplify input signals having a magnitude below said reference level, to said power amplifier, if no excess input signal is detected, and to supply, a higher level of operating voltage being sufficient to effectively amplify input signals having a magnitude above said reference level, to said power amplifier, whenever an excess input signal is detected;

f) an automatic gain control circuit, coupled to the input of said power amplifier, for controlling the magnitude of said input signal(s) prior to amplification;

g) circuitry for sampling said excess input signal; and h) a control circuitry, for compensating changes in the gain of said power amplifier during the presence of said excess input signal by controlling the gain of said automatic gain control circuit, according to the samples of said excess input signal.

14. Apparatus according to claim 13, comprising:

a) a first voltage source for feeding said power amplifier;

b) a second voltage source for feeding said power amplifier whenever an excess input signal is detected;

c) a variable impedance connected between the voltage supply input of said power amplifier and said second voltage source;

wherein the analog control circuit is configured for controlling said variable impedance to be in its highest impedance state whenever no excess input signal is detected, and to be in a low impedance state whenever an excess input signal is detected, said low impedance state being essentially equal to the value required to increase said second voltage source to a level capable of tracking the magnitude of said excess input signal.

15. Apparatus according to claim 13, comprising:

a) a first voltage source for feeding said power amplifier whenever no excess input signal is detected;

b) a second voltage source for feeding said power amplifier whenever an excess input signal is detected;

c) a voltage amplifier connected between the voltage supply contact of said power amplifier and said second voltage source, for supplying a voltage level, being higher than the voltage of said first voltage source, to said voltage supply contact of said power amplifier;

wherein the analog control circuit is configured for controlling said voltage amplifier to supply a voltage level, being higher than the voltage of said first voltage source, to said voltage supply contact of said power amplifier, whenever no excess input signal is detected.

16. Apparatus according to claim 14, in which the variable impedance is a controllable impedance.

17. Apparatus according to claim 14, in which the variable impedance is an inductor or a diode.

18. Apparatus according to claim 17, in which the controllable impedance is a bipolar transistor or a FET.

19. Apparatus according to claim 13 wherein the sampling circuit is configured for sampling the level of operating voltage supplied to said power amplifier, the apparatus further comprising:

a) a comparator for generating an error signal by comparing between the sampled level of operating voltage supplied to said power amplifier, with the level of the excess input signal; and b) a negative feedback loop for accurately controlling the operating voltage supplied to said power amplifier, by using said error signal.

20. Apparatus according to claim 13 wherein the sampling circuit is configured for sampling the level of RF output signals, amplified by said power amplifier, the apparatus further comprising:

a) a comparator for generating an error signal by comparing between the sampled level of RF output signals, amplified by said power amplifier, with the level of the excess input signal; and b) a negative feedback loop for accurately controlling the operating voltage supplied to said power amplifier, by using said error signal.

21. Apparatus according to claim 14 or 15, wherein a common power supply provides both the first and second voltage sources, the voltage being supplied by the second voltage source having an essentially identical value, or a lower value, as that of the first voltage source, as provided in steps (a) and (b).

22. Apparatus for improving the efficiency and the dynamic range of a power amplifier operated with signals having a large peak-to-average ratio, comprising:

a) a main amplifier;

b) an auxiliary amplifying circuitry of a Doherty configuration, said main amplifier and said auxiliary amplifying circuitry comprising said power amplifier;

c) a modulator for generating a modulated signal that is input to the power amplifier;

d) a baseband signal source for generating a baseband waveform that that is input to said modulator;

e) a voltage slicer for extracting an excess signal from the baseband waveform when the magnitude of the baseband waveform exceeds a reference level;

f) a sampling circuit for continuously sampling the magnitude of said baseband waveform, for detecting an excess input signal according to a predetermined reference level, above which at least a portion of said baseband waveform is defined as an excess baseband signal;

g) a power supply for supplying an operating voltage to said power amplifier; and h) an analog control circuit, operating in combination with said power supply, for causing said power supply to supply a constant level of operating voltage being essentially constant and sufficient to effectively amplify input signals having a magnitude below said reference level, to said power amplifier, if no excess input signal is detected, and to supply a variable increased level of operating voltage that essentially tracks the magnitude of said excess input signal and is sufficient to effectively amplify input signals having a magnitude above said reference level, to said power amplifier, whenever an excess input signal is detected.

23. A method for improving the efficiency and the dynamic range of a power amplifier operated with signals having a large peak-to-average ratio, comprising:
   a) providing an auxiliary amplifying circuitry of a Doherty configuration and a main amplifier, said main amplifier and said auxiliary amplifying circuitry comprising said power amplifier, the Doherty configuration consisting of an auxiliary amplifier directly connected to a load, the main amplifier being coupled to said load through a Doherty coupler;
   b) determining a reference level, above which at least a portion of the magnitude of an input signal being a modulated signal that is input to said power amplifier, or a baseband waveform that is used to generate said modulated signal, is defined as an excess input signal such that said reference level is essentially equal to the level of the input signal that causes main and auxiliary amplifier circuitries to output essentially the same power into the load, thereby reaching the maximal output power level under a DC operating voltage;
   c) continuously sampling said magnitude of said input signal, for detecting an excess input signal;
   d) continuously amplifying the input signal with said main amplifier by supplying a constant operating voltage to said main amplifier circuitry;
   e) as long as no excess input signal is detected, amplifying the input signal by the auxiliary amplifier circuitry by supplying, to said auxiliary amplifier, the same DC operating voltage supplied to said main amplifier; and
   f) whenever an excess input signal is detected, concurrently supplying a variable increased level of DC operating voltage to said auxiliary amplifying circuitry, said increased level of operating voltage being sufficient to effectively amplify input signals having said magnitude above said reference level.

24. A method for improving the efficiency and the dynamic range of a power amplifier, comprising:
   a) providing a main amplifier and an auxiliary amplifying circuitry of a Doherty configuration, said main amplifier and said auxiliary amplifying circuitry comprising said power amplifier;
   b) determining a reference level, above which at least a portion of the magnitude of an input signal being a modulated signal that is input to said power amplifier, or a baseband waveform that is used to generate said modulated signal, is defined as an excess input signal;
   c) continuously sampling said magnitude of said input signal, for detecting an excess input signal;
   d) supplying a constant level of operating voltage to said power amplifier, if no excess input signal is detected, said constant level of operating voltage being sufficient to effectively amplify input signals having a magnitude below said reference level;
   e) whenever an excess input signal is detected, concurrently supplying a variable increased level of operating voltage to said power amplifier, said increased level of operating voltage that essentially tracks the magnitude of said excess input signal and is sufficient to effectively amplify input signals having a magnitude above said reference level; and
   f) lowering impedance of a load received by said main amplifier as the input signal increases, thereby increasing power output of said power amplifier while retaining output voltage of said main amplifier at a constant level.

25. A method according to claim 24, wherein the auxiliary amplifying circuitry is activated as the voltage of the main amplifier reaches its maximum output voltage.

26. A method according to claim 25, wherein the output voltage of the auxiliary amplifying circuitry exceeds the value of the maximum output voltage of the main amplifier.

27. A method according to claim 26, wherein the output voltage of the auxiliary amplifying circuitry is approximately 1.3 times the maximum output voltage of the main amplifier at an enhancement factor of 1.5, an enhancement factor being defined as a ratio between a maximal value of the higher level of operating voltage to the lower level of operating voltage.

28. A method according to claim 26, wherein the output voltage of the auxiliary amplifying circuitry is approximately 2 times the maximum output voltage of the main amplifier at an enhancement factor of 2, an enhancement factor being defined as a ratio between a maximal value of the higher level of operating voltage to the lower level of operating voltage.

29. Apparatus for improving the efficiency and the dynamic range of a power amplifier operated with signals having a large peak-to-average ratio, comprising:
   a) a main amplifier;
   b) an auxiliary amplifying circuitry of a Doherty configuration, said main amplifier and said auxiliary amplifying circuitry comprising said power amplifier, the output of said auxiliary amplifying circuitry being directly connected to a load and being operated in combination with said main amplifier;
   c) a sampling circuit for continuously sampling the magnitude of an input signal being a modulated signal that is input to said power amplifier, or of a baseband waveform that is used to generate said modulated signal, for detecting an excess input signal according to a predetermined reference level, above which at least a portion of said input signal is defined as the excess input signal;
   d) a power supply for supplying an operating voltage to said power amplifier; and
   e) an analog control circuit, operating in combination with said power supply, for causing said power supply to supply a constant level of operating voltage being sufficient to effectively amplify input signals having a magnitude below said reference level, to said power amplifier, if no excess input signal is detected, and to concurrently supply to said power amplifier, whenever an excess signal is detected, a variable increased level of operating voltage that essentially tracks the magnitude of said excess input signal and is sufficient to effectively amplify input signals having a magnitude above said reference level.

30. Apparatus for improving the efficiency and the dynamic range of a power amplifier operated with signals having a large peak-to-average ratio, comprising:
   a) a main amplifier;
   b) an auxiliary amplifying circuitry of a Doherty configuration, said main amplifier and said auxiliary amplifying circuitry comprising said power amplifier;
   c) a Doherty coupler for coupling said main amplifier and a load;
   d) a sampling circuit for continuously sampling the magnitude of an input signal being a modulated signal that input to said power amplifier, or of a baseband waveform that is used to generate said modulated signal, for detecting an excess input signal according to a predetermined reference level, above which at least a portion of said input signal is defined as the excess input signal;

e) a power supply for supplying an operating voltage to said power amplifier; and f) an analog control circuit, operating in combination with said power supply, for causing said power supply to supply a constant level of operating voltage being sufficient to effectively amplify input signals having a magnitude below said reference level, to said power amplifier, if no excess input signal is detected, and to concurrently supply to said power amplifier, whenever an excess signal is detected, a variable increased level of operating voltage that essentially tracks the magnitude of said excess input signal and is sufficient to effectively amplify input signals having a magnitude above said reference level.

31. Apparatus according to claim 30, further comprising a phase shifting circuitry having essentially similar phase shift to the phase shift that introduced by said Doherty coupler, the input of the auxiliary amplifying circuitry being coupled to the input of the main amplifier through said phase shifting circuitry.

* * * * *

UNITED STATES PATENT AND TRADEMARK OFFICE
CERTIFICATE OF CORRECTION

PATENT NO.   : 6,492,867 B2  Page 1 of 2
DATED        : December 10, 2002
INVENTOR(S)  : Bar-David, Israel It is certified that error appears in the above-identified patent and that said Letters Patent is hereby corrected as shown below:

Title page, Item [54] and Column 1, line 3,
Title, "AMPLIFIERS," should read -- AMPLIFIERS --

Title page,
Item [56], References Cited, OTHER PUBLICATIONS, "Kenney, J.S. e tla.," should read -- Kenney, J.S. et al., --

Column 6,
Line 21, "phase shift that" should read -- phase shift that is --
Line 67, "vaveform" should read -- waveform --

Column 8,
Line 39, "illustrates" should read -- illustrate --

Column 9,
Line 52, "effecting" should read -- affecting --

Column 11,
Line 25, "$0.66V_{max})$" should read -- $0.66V_{max}$ --

Column 14,
Lines 14 and 26, "level with" should read -- level and --
Line 34, "value," should read -- value, as that of the first voltage source, --
Line 34, "claim 3" should read -- claim 4 --

Column 18,
Line 65, "input to" should read -- is input to --

UNITED STATES PATENT AND TRADEMARK OFFICE
CERTIFICATE OF CORRECTION

PATENT NO. : 6,492,867 B2
DATED : December 10, 2002
INVENTOR(S) : Bar-David, Israel It is certified that error appears in the above-identified patent and that said Letters Patent is hereby corrected as shown below:

<u>Column 20,</u>
Line 7, "introduced" should read -- is introduced --

Signed and Sealed this

Eighth Day of February, 2005

JON W. DUDAS
*Director of the United States Patent and Trademark Office*